US 6,613,622 B1

(12) United States Patent
Nair et al.

(10) Patent No.: US 6,613,622 B1
(45) Date of Patent: Sep. 2, 2003

(54) METHOD OF FORMING A SEMICONDUCTOR DEVICE AND STRUCTURE THEREFOR

(75) Inventors: Rajesh S. Nair, Chandler, AZ (US); Takeshi Ishiguro, Aizuwakamatsu (JP)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/194,165

(22) Filed: Jul. 15, 2002

(51) Int. Cl.[7] .................. H01L 21/337; H01L 29/76
(52) U.S. Cl. .................. 438/188; 438/199; 257/341; 257/342; 257/343
(58) Field of Search .................. 257/342, 341, 257/343, 335–339, 345, 372, 375, 376, 492, 493; 438/188, 199, 514, 549, 301, 303, 305, 306, 140, 180, 519, 526, 527

(56) References Cited

U.S. PATENT DOCUMENTS 6,168,983 B1 * 1/2001 Rumennik et al. .......... 438/188
6,424,007 B1    7/2002 Disney

FOREIGN PATENT DOCUMENTS

WO    WO00/46859    8/2000

OTHER PUBLICATIONS

"Double–resurf 700V N–channel LDMOS with Best–in–class On–resistance", Zia Hossain, Mohamed Imam, Joe Fulton, Masami Tanaka, Proc. of the 14th IEEE International Symposium on Power Semiconductor Devices and ICs, ISPSD '02, pp. 137–140, Santa Fe, NM, Jun. 4–7, 2002.

* cited by examiner

Primary Examiner—Steven Loke
Assistant Examiner—Donghee Kang
(74) Attorney, Agent, or Firm—Robert Hightower, Atty.

(57) ABSTRACT

A semiconductor device (10, 40) is formed to have a well (19) in a substrate (11). The well and the substrate have the same doping type, for example both P-type or both N-type. Low resistance contact regions (26, 27) of a second conductivity type are formed to at least abut the well. A drain (17) is formed within one low resistance contact region. A source (12) is formed in the substrate and laterally displaced from the other low resistance contact region. A buried layer (21, 22, 23) is formed laterally across the well.

20 Claims, 5 Drawing Sheets

US 6,613,622 B1

METHOD OF FORMING A SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various techniques to form low on-resistance semiconductor devices such as field effect transistors. One particular method utilized a buried layer disposed in a doped region that has a conductivity that is opposite to the conductivity of the substrate. One example of a similar device is disclosed in U.S. Pat. No. 6,168,983. Transistors formed according to the methods disclosed in the above referenced patent often had an on-resistance that changed or drifted after the transistor was manufactured thereby resulting in a higher on-resistance than desired. Additionally, there was not a low conductance path to contact the doped region. Therefore, the resulting on-resistance was greater than desired due to changes in the transistor characteristics required to achieve the desired breakdown voltage.

Accordingly, it is desirable to have a semiconductor device that has an on-resistance that does not substantially drift after the device is manufactured, and that has a low on-resistance.

For simplicity and clarity of illustration, elements in the figures are not necessarily to scale, and the same reference numbers in different figures denote the same elements. Additionally, descriptions and details of well known steps, techniques, and elements are omitted for simplicity of the description.

DETAILED DESCRIPTION OF THE DRAWINGS

The present description includes a method of forming a semiconductor device that has, among other features, a low on-resistance and an on-resistance that does not substantially drift or change.

Figure 1:
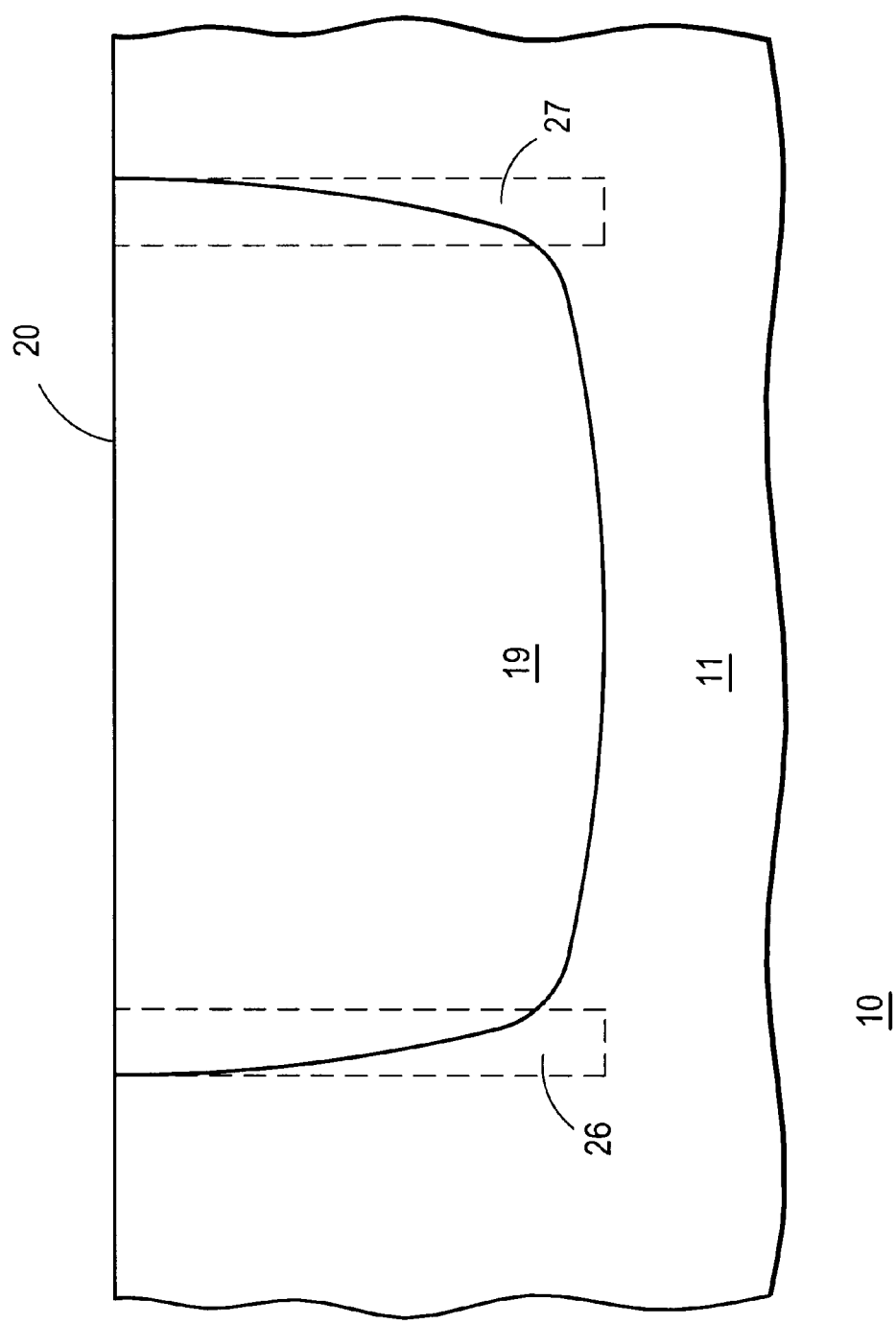
FIG. 1 schematically illustrates an enlarged cross-sectional portion of an embodiment of a semiconductor device at a stage of manufacturing in accordance with the present invention.

FIG. 1 schematically illustrates an enlarged cross-sectional portion of an embodiment of a semiconductor device 10 at a stage in the manufacturing process. In the preferred embodiment, device 10 is a lateral N-channel MOS transistor having a high breakdown voltage of about seven hundred volts (700V) or greater. Device 10 includes a substrate 11 that is formed from a semiconductor material of a first conductivity type, preferably P-type. A well 19 of the first conductivity type is formed in substrate 11 extending into substrate 11 from a surface 20. Well 19 typically has a doping concentration that is greater than the doping concentration of substrate 11. In the preferred embodiment, substrate 11 has a P-type doping concentration between approximately 5E13 atoms/cm$^3$ and 5E15 atoms/cm$^3$ and preferably is approximately 1E14 atoms/cm$^3$ to 2E14 atoms/cm$^3$. Well 19 may be formed by various methods including high energy implantation, epitaxial growth, selective modulation doping or other well know methods. After well 19 is formed, low resistance regions 26 and 27 of a second conductivity type, that is opposite to the first conductivity type, are formed along the side walls of well 19. For clarity of the description, regions 26 and 27 are illustrated in FIG. 1 by dashed lines. As will be seen hereinafter, regions 26 and 27 are used to form a low resistance contact for subsequent buried layers formed in well 19. Those skilled in the art will note that regions 26 and 27 may be formed as two separate regions and both may be formed at the same time or step in the manufacturing process. Regions 26 and 27 typically intersect a portion of the well or may be positioned to completely overlap the side-walls of well 19 and extend into well 19 or may be formed abutting the sidewalls as long as the subsequent low resistance path is formed. Regions 26 and 27 generally are formed orthogonal to surface 20. In the preferred embodiment, regions 26 and 27 are formed to overlap the side-walls of well 19 as illustrated by the dashed lines. Regions 26 and 27 may be formed by various methods that are well known to those skilled in the art, including trench refill, deep diffusion drive, chain implants and the like.

Figure 2:
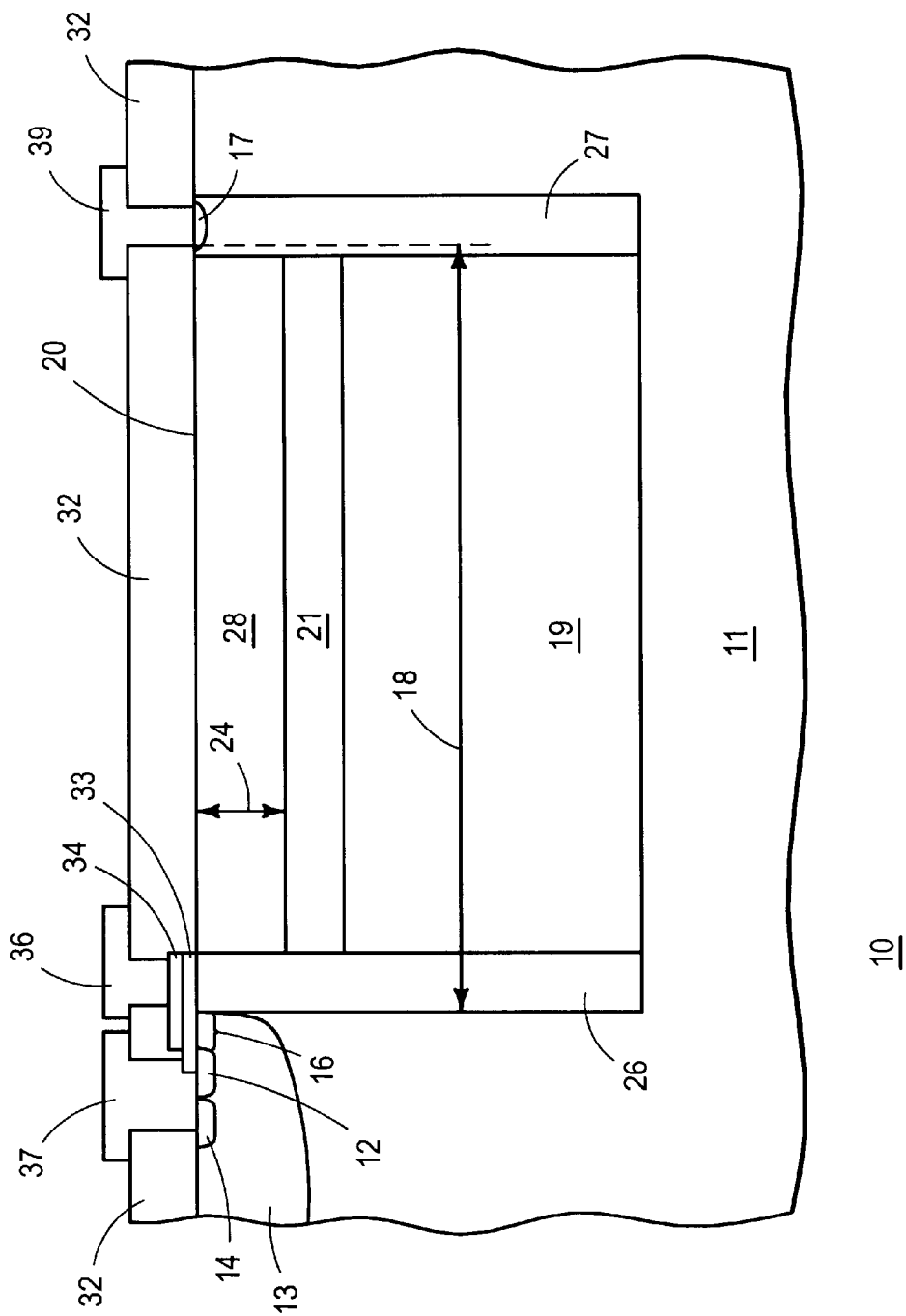
FIG. 2 schematically illustrates an enlarged cross-sectional portion of an embodiment of the semiconductor device of FIG. 1 at a subsequent manufacturing stage in accordance with the present invention.

FIG. 2 schematically illustrates an enlarged cross-sectional portion of device 10 at a subsequent stage of manufacturing. A buried layer 21 of the second conductivity type is formed laterally across well 19 and forms electrical contact to regions 26 and 27. Buried layer 21 is formed a first distance 24, illustrated by an arrow, from surface 20 of substrate 11. Typically distance 24 is between approximately one and three microns (1–3 microns) and preferably is about two (2) microns.

A source 12 of the second conductivity type, preferably N-type, is formed in substrate 11 adjacent and laterally displaced a second distance from region 26. Optionally, a protection region 13 of the first conductivity type may be formed in substrate 11 extending from surface 20 a distance into substrate 11 near to, and preferably abutting, region 26. Region 13 assists in reducing parasitic transistor effects and in maintaining a high breakdown voltage for device 10. The second distance between source 12 and region 26 forms a channel region 16. It should be noted that the channel region is formed in material of the first conductivity type, either in a portion of substrate 11 or a portion of region 13. Generally the second distance results in channel region 16 having a length of about 0.5 to two microns. An optional contact protection region 14 may be formed adjacent source 12 to also assist in minimizing parasitic transistor effects within device 10. A gate insulator 33 is formed overlying channel region 16. Insulator 33 may extend to overlie a portion of source 12 in addition to a portion of region 26 and well 19. A gate 34 is formed overlying insulator 33. A drain region 17 of the second conductivity type is formed in region 27 and is laterally displaced a third distance 18, illustrated generally by an arrow, from channel region 16. As those skilled in the art will understand, third distance 18 assists in providing a high breakdown voltage for device 10, thus, drain region 17 typically is formed as far from channel region 16 as possible. Distance 18 often is scaled using a relationship of about 0.05 microns/Volt for each volt that will be dropped across distance 18. Forming drain region 17 in region 27 provides a low resistance path for current flow from layer 21 through region 27 to drain region 17.

An insulator 32, for example silicon dioxide, is formed overlying device 10 and openings are formed within insulator 32 to facilitate forming contact electrodes for electrically active sections of device 10. A source electrode 37 is formed to contact source 12 and optionally to contact protection region 14. A drain electrode 39 is formed to contact drain region 17, and a gate electrode 36 is formed to contact gate 34.

Buried layer 21 is formed first distance 24 from surface 20 and into well 19. Buried layer 21 functions as a conduction path, often referred to as a drift region, between channel region 16 and drain region 17. The portion of well 19 that is between buried layer 21 and surface 20 forms a top slice 28 of well 19. Well 19, top slice 28, and buried layer 21 are doped to have a charge concentration that is sufficient to support the operating mode often referred to as Reduced Surface Field Effect (RESURF) in buried layer 21. It is believed in the industry that the maximum charge that can be used for a cross-sectional area and still maintain an electric field below the value at which avalanche breakdown occurs is a charge concentration of $1e12$ atoms/cm$^2$ times the number of P-N junction depletion regions extending into the area. In the preferred embodiment, top slice 28 and the remainder of well 19 are doped to have a charge concentration of $1E12$ atoms/cm$^2$. Buried layer 21 is also doped to have a charge concentration that is adequate to support the RESURF operation. In the preferred embodiment, buried layer 21 is doped to have a charge concentration of $2E12$ atoms/cm$^2$ since layer 21 has to support RESURF from two different regions, thus, has two different P-N junctions depletion regions extending into layer 21. First distance 24 is formed to be sufficient to allow forming the required charge concentration in top slice 28. Buried layer 21 is formed to have a cross sectional area that is sufficient to provide a low resistance path for the current that is to be conducted through device 10. In the preferred embodiment, distance 24 is between one and three microns and layer 21 is formed to have a typical integrated dopant concentration of about $2E12$ atoms/cm$^2$ to $3E12$ atoms/cm$^2$. Utilizing top slice 28 to separate buried layer 21 from insulator 32 reduces the on-resistance sensitivity to charges that are trapped within insulator 32. Consequently, the on-resistance of device 10 is stable after device 10 is formed and doesn't drift due to the charges that may be trapped within insulator 32. Thus, device 10 provides a more stable on-resistance than previous transistors. Additionally, the low resistance contacts provided by regions 26 and 27 reduce the resistance to current flow through device 10 further lowering of the on-resistance of device 10. In the preferred embodiment region 26 is formed to have a higher doping concentration than region 27 because region 26 is closer to source 12 and a higher doping concentration in region 26 could lower the on resistance of device 10. Typically, regions 26 and 27 have a doping concentration of about $5E14$ to $5E15$ atoms/cm$^3$. However, region 26 may have a doping concentration that is greater and up to two times the doping concentration of region 27.

Figure 3:
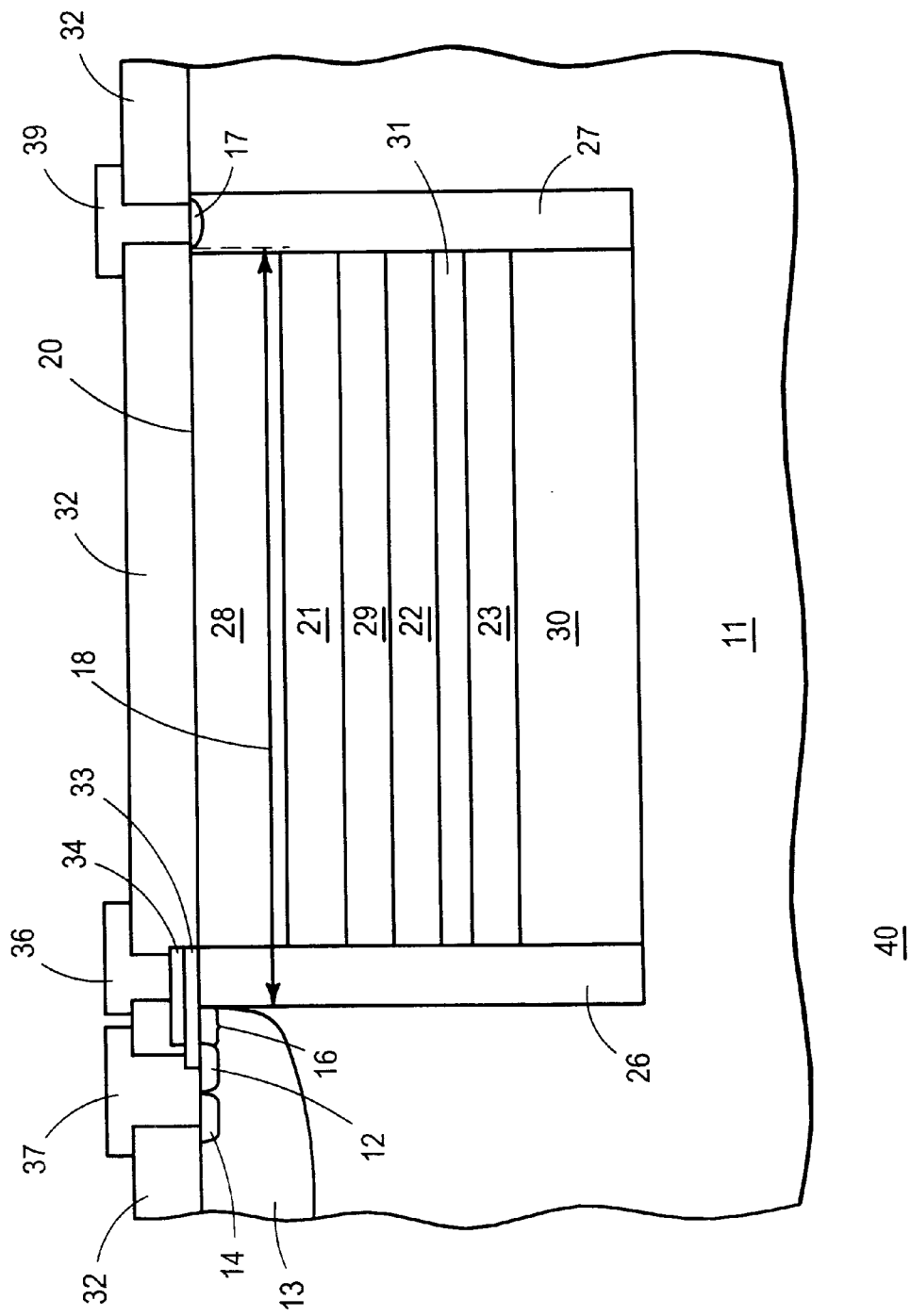
FIG. 3 schematically illustrates an enlarged cross-sectional portion of an alternate embodiment of the semiconductor device of FIG. 2 in accordance with the present invention.

FIG. 3 schematically illustrates an enlarged cross-sectional portion of a semiconductor device 40 that is an alternate embodiment of device 10 shown in FIG. 2. Device 40 includes a plurality of buried layers 21, 22, and 23 that are similar to buried layer 21. Buried layers 21, 22, and 23 are spaced apart from each other by alternating layers or alternating slices of well 19. Buried layers 22 and 23 form middle slices 29 and 31 of well 19 and leave a lower slice 30 of well 19. Because middle slices 29 and 31 each have a buried layer adjacent on two surfaces of each of the middle slices, middle slices 29 and 31 are formed to have a higher charge concentration than top slice 28 and bottom slice 30. Preferably, middle slices 29 and 31 are doped to have a charge concentration of $2E12$ atoms/cm$^2$ to support RESURF operation in layers 21, 22, and 23. Those skilled in the art will understand that doping of semiconductor material typically provides doping that may change gradually over distance, thus, the target doping of middle slices 29 and 31 is $2E12$ atoms/cm$^2$ however, the charge concentration may vary slightly over the vertical distance from bottom slice 30 through middle slices 29 and 31 to top slice 28. Buried layers 22 and 23 are doped similarly to buried layer 21. Buried layers 21, 22, and 23 in addition to slices 28, 29, 30, and 31 can be formed from various techniques including high energy implantation, epitaxial growth, modulation doping, and various other methods that are well known to those skilled in the art.

Each of buried layers 21, 22, and 23 form a low resistance conduction path for current that is to be carried by device 40. Each of buried layers 21, 22, and 23 can be viewed as a resistor in parallel with the resistor of the adjacent slice. Since parallel resistors form a resistance that is lower than the value of the largest resistor in the parallel path, the resistance provided by buried layers 21, 22, and 23 is lower than the resistance provided by any one of layers 21, 22, or 23. Therefore, device 40 provides a very low on-resistance.

Figure 4:
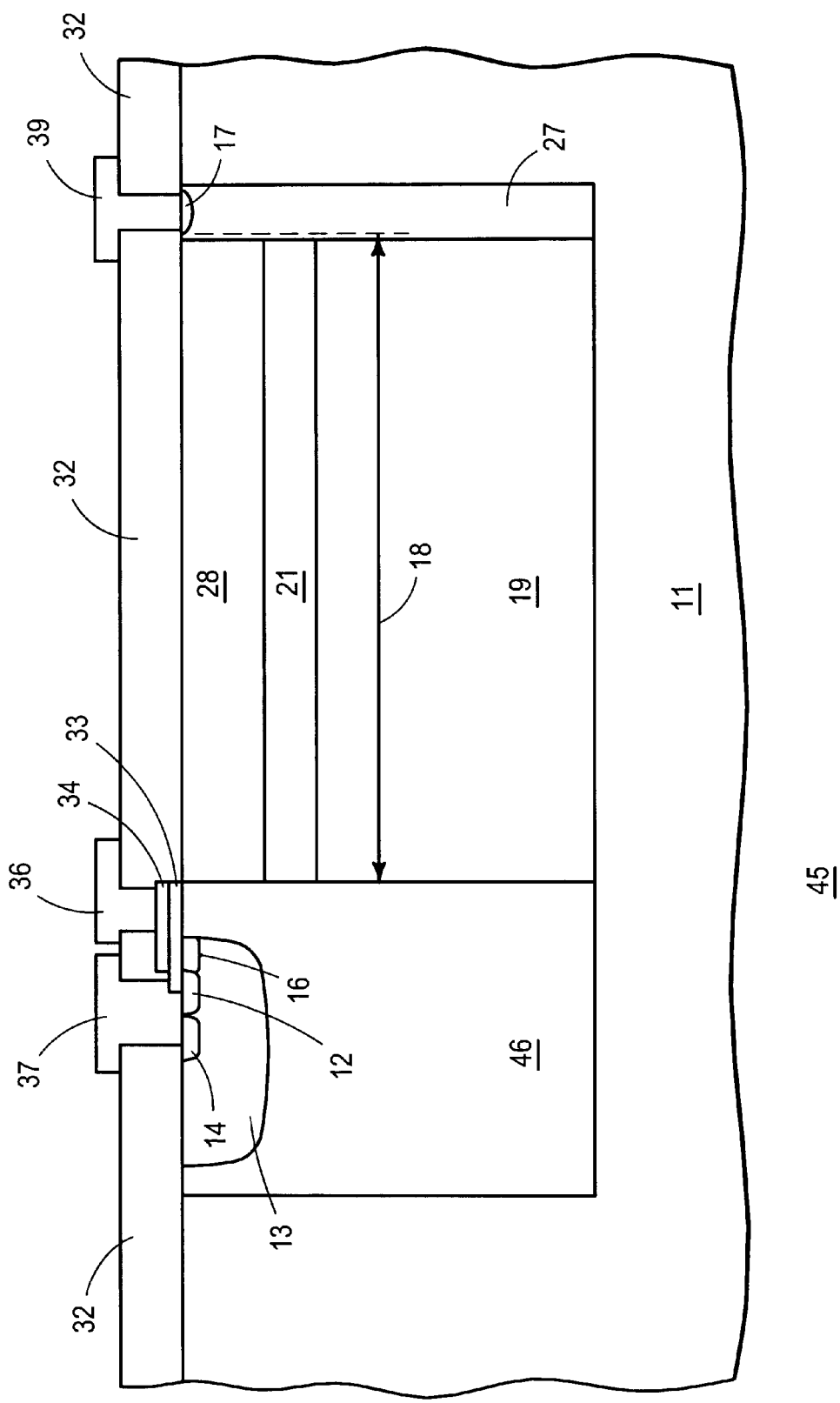
FIG. 4 schematically illustrates an enlarged cross-sectional portion of another alternate embodiment of the semiconductor device of FIG. 2 in accordance with the present invention.

FIG. 4 schematically illustrates an enlarged cross-sectional portion of a semiconductor device 45 that is another alternate embodiment of device 10 shown in FIG. 2. Device 45 has a low resistance region 46 that is similar to region 26 shown in FIG. 2. Region 46 is formed by techniques that are similar to the techniques used to form region 26 shown in FIG. 2. However, region 46 is formed to have a width that is sufficient to form source 12, region 14, channel region 16, and region 13 within region 46 and overlying region 46. Because region 13 is within region 46, region 13 and source 12 are isolated from substrate 11 thereby facilitating using device 45 in applications referred to as high-side drive.

Figure 5:
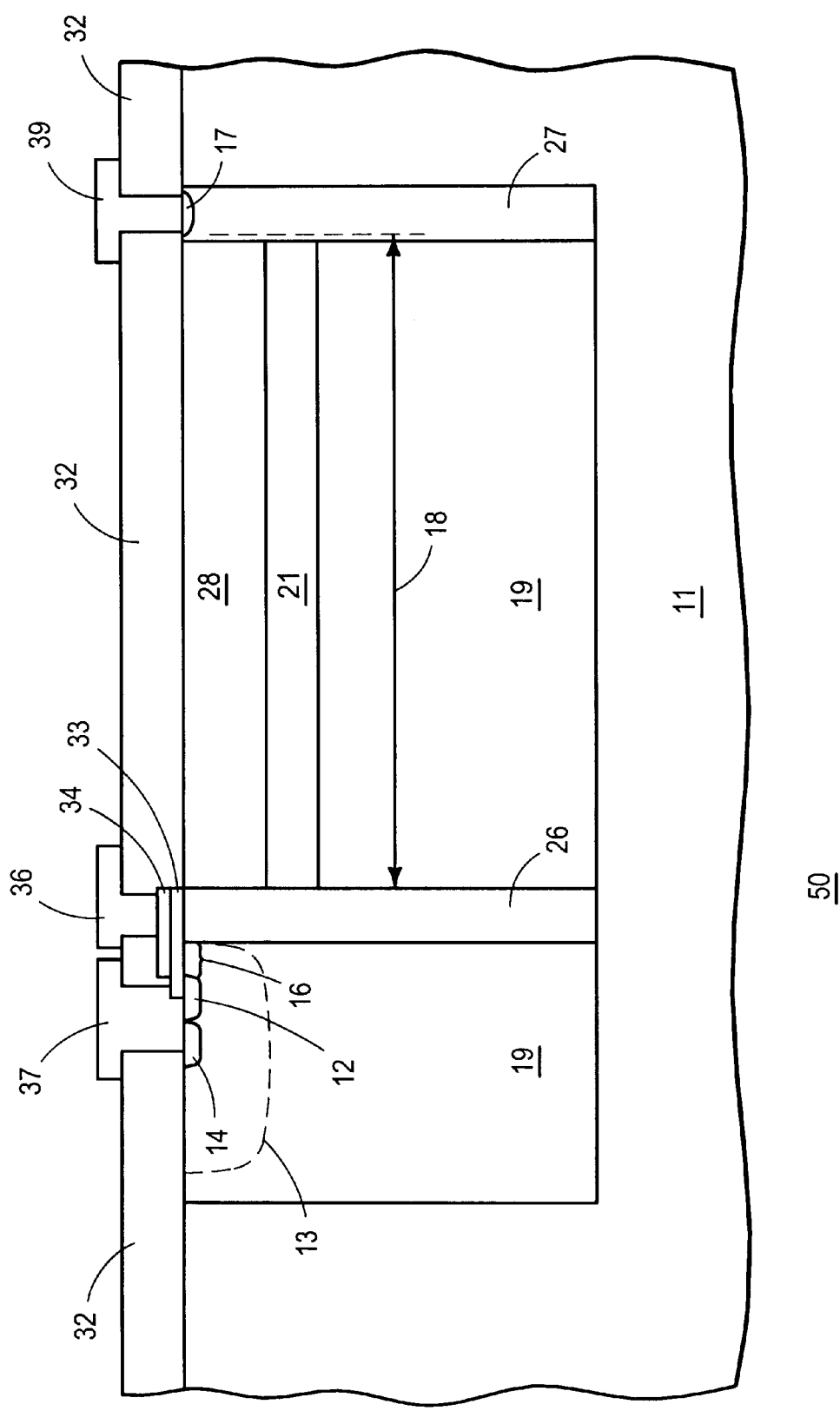
FIG. 5 schematically illustrates an enlarged cross-sectional portion of a further alternate embodiment of the semiconductor device of FIG. 2 in accordance with the present invention.

FIG. 5 schematically illustrates an enlarged cross-sectional portion of a semiconductor device 50 that is a further alternate embodiment of device 10 shown in FIG. 2. Well 19 is formed to have a width that is extends past region 26 so that region 26, source 12, region 14, and channel region 16 are formed within well 19. Thus, region 26 intersects a portion of well 19 as region 26 extends into well 19 and substrate 11. Because well 19 has such a width, region 13 is optional and typically is replaced by a portion of well 19, thereby, saving manufacturing steps, reducing the number of masks used for forming device 50, thereby lowering the manufacturing costs of device 50. Optional region 13 is illustrated by dashed lines.

In view of all of the above, it is evident that a novel method of forming a device is disclosed. Included among other features is forming a device in a well that is the same conductivity type as the channel region and the substrate which assists in providing the unexpected advantage of reducing on-resistance drift while also reducing the value of the on-resistance. For example, forming an N-channel device using a P-type well that is formed in a P-type substrate. Forming low resistance regions 26 and 27 to contact the buried layers provides a low resistance path for current flow and also assists in lowering the on-resistance.

While the invention is described with specific preferred embodiments, it is evident that many alternatives and variations will be apparent to those skilled in the semiconductor arts. For example, the doping types may be reversed to form a P-channel transistor.

What is claimed is:

1. A method of forming a semiconductor device comprising:
   providing a semiconductor substrate of a first conductivity type having a surface;
   forming a well of the first conductivity type extending into the semiconductor substrate from the surface of the semiconductor substrate;
   forming a first region of a second conductivity type intersecting a portion of the well and extending from the surface of the semiconductor substrate including forming the second conductivity type opposite in conductivity to the first conductivity type;
   forming a source region of the second conductivity type in the semiconductor substrate and laterally displaced a first distance from the first region;
   forming a second region of the second conductivity type abutting sidewalls of the well and extending from the surface of the semiconductor substrate including forming the second region laterally displaced from the source region wherein the well is between the source region and the second region;
   forming a drain region of the second conductivity type in the second region and intersecting the surface of the semiconductor substrate; and
   forming at least one buried layer of the second conductivity type within the well and extending laterally across the well to intersect the first region.

2. The method of claim 1 wherein forming the source region type includes forming a protection region of the first conductivity type adjacent to the first region and further including forming the source region within the protection region.

3. The method of claim 1 wherein forming the first region includes forming the first region to have a lower doping concentration than a doping concentration of the second region.

4. The method of claim 1 wherein forming the at least one buried layer of the second conductivity type within the well and extending laterally across the well includes forming a plurality of buried layers of the second conductivity type within the well and extending laterally across the well wherein each of the plurality of buried layers is spaced apart from other of the plurality of buried layers by a portion of the well.

5. The method of claim 4 wherein forming the plurality of buried layers includes forming each buried layer to have a charge concentration no greater than 2E12 atoms/cm$^2$ and forming the well to have a charge concentration no greater than 2E12 atoms/cm$^3$.

6. The method of claim 4 further including forming the first region to have a lower doping concentration than the second region.

7. The method of claim 1 wherein the step of forming the second region includes forming both the well and the first region between the source region and the second region.

8. The method of claim 1 wherein forming the at least one buried layer of the second conductivity type within the well and extending laterally across the well includes forming the at least one buried layer to have a charge concentration no greater than 2E12 atoms/cm$^2$ and the well to have a charge concentration no greater than 1E12 atoms/cm$^2$.

9. The method of claim 1 wherein forming the well of the first conductivity type includes forming the well to have a doping concentration that is greater than a doping concentration of the semiconductor substrate.

10. The method of claim 1 wherein forming the at least one buried layer of the second conductivity type within the well includes forming the at least one buried layer a first distance from the surface of the semiconductor substrate.

11. The method of claim 1 wherein forming the first region of the second conductivity type intersecting the portion of the well includes forming the well to have a width that extends laterally past the first region with the first region intersecting a portion of the well and extending into the well and wherein the source region is formed within a portion of the well.

12. The method of claim 1 wherein forming the first region of the second conductivity type intersecting the portion of the well includes forming the first region to have a width extending laterally past the source region wherein the source region overlies a portion of the first region.

13. A method of forming a field effect transistor comprising:
    providing a semiconductor substrate of a first conductivity type and a first doping concentration including forming the semiconductor substrate to have a surface;
    forming a well of the first conductivity type in the semiconductor substrate including forming the well to have a second doping concentration that is greater than the first doping concentration;
    forming a first region of a second conductivity type extending into the semiconductor substrate from the surface of the semiconductor substrate and abutting the well;
    forming a source region of the second conductivity type in the semiconductor substrate near the surface of the semiconductor substrate including forming the source region displaced a first distance from the first region wherein the first region is between the well and the source region;
    forming a second region of the second conductivity type extending into the semiconductor substrate from the surface of the semiconductor substrate and abutting the well wherein the second region is laterally displaced from the source region and the well is between the source region and the second region;
    forming a drain region of the second conductivity type in the second region near the surface of the semiconductor substrate; and
    forming at least one buried layer of the second conductivity type within the well and extending laterally across the well to electrically contact both the first region and the second region including forming an uppermost surface of the at least one buried layer a second distance below the surface of the semiconductor substrate.

14. The method of claim 13 wherein forming the at least one buried layer includes forming the at least one buried layer to have a charge concentration no greater than 1E12 atoms/cm$^2$.

15. The method of claim 13 wherein forming the first region of the second conductivity type includes forming the first region to have a lower doping concentration than the second region.

16. The method of claim 13 wherein forming the drain region of the second conductivity type includes forming the drain region to have a greater doping concentration than the second region.

17. The method of claim 13 wherein forming the at least one buried layer of the second conductivity type within the well includes forming a plurality of buried layers extending laterally across the well and intersecting both the first region and the second region.

18. A semiconductor device comprising:
   a semiconductor substrate of a first conductivity type having a surface;
   a source region of a second conductivity type in the semiconductor substrate near the surface of the semiconductor substrate;
   a drain region of the second conductivity type in the semiconductor substrate near the surface of the semiconductor substrate and laterally displaced from the source region;
   a well of the first conductivity type in the semiconductor substrate between the source region and the drain region and laterally displaced a first distance from the source region wherein the well has sidewalls;
   a first region of the second conductivity type extending into the semiconductor substrate from the surface of the semiconductor substrate and abutting the well, the first region positioned between the source region and the well and laterally displaced from the source region;
   a second region of the second conductivity type extending into the semiconductor substrate from the surface of the semiconductor substrate and abutting the well wherein the well is positioned between the second region and the source region; and
   at least one buried layer of the second conductivity type within the well and extending laterally across the well.

19. The semiconductor device of claim 18 wherein the source region of the second conductivity type includes a protection region of the first conductivity type adjacent to the well wherein the source region is within the protection region.

20. The semiconductor device of claim 18 wherein the at least one buried layer of the second conductivity type within the well and extending laterally across the well includes a plurality of buried layers of the second conductivity type within the well and extending laterally across the well wherein each of the plurality of buried layers is spaced apart from other of the plurality of buried layers by a portion of the well.

* * * * *